(12) United States Patent
Winter et al.

(10) Patent No.: US 6,685,492 B2
(45) Date of Patent: Feb. 3, 2004

(54) SOCKETS FOR TESTING ELECTRONIC PACKAGES HAVING CONTACT PROBES WITH CONTACT TIPS EASILY MAINTAINABLE IN OPTIMUM OPERATIONAL CONDITION

(75) Inventors: John M. Winter, Wrentham, MA (US); Larre H. Nelson, Attleboro, MA (US); John C. Bergeron, Attleboro, MA (US)

(73) Assignee: Rika Electronics International, Inc., Attleboro, MA (US)

( * ) Notice: Subject to any disclaimer, the term of this patent is extended or adjusted under 35 U.S.C. 154(b) by 0 days.

(21) Appl. No.: 10/151,060

(22) Filed: May 17, 2002

(65) Prior Publication Data

US 2003/0124895 A1 Jul. 3, 2003

Related U.S. Application Data

(60) Provisional application No. 60/342,228, filed on Dec. 27, 2001.

(51) Int. Cl.[7] .................... H01R 13/24; H01R 27/00; G01R 31/02
(52) U.S. Cl. .................... 439/219; 324/754; 439/700
(58) Field of Search ................... 439/700, 219, 439/482; 324/754, 757, 761

(56) References Cited

U.S. PATENT DOCUMENTS

| | | | | |
|---|---|---|---|---|
| 3,435,168 A | | 3/1969 | Cooney | |
| 4,397,519 A | * | 8/1983 | Cooney | 439/824 |
| 5,200,695 A | | 4/1993 | Kazama | |
| 5,990,697 A | * | 11/1999 | Kazama | 324/761 |
| 6,046,597 A | * | 4/2000 | Barabi | 324/755 |
| 6,053,777 A | * | 4/2000 | Boyle | 439/700 |
| 6,084,421 A | * | 7/2000 | Swart et al. | 324/755 |
| 6,159,056 A | | 12/2000 | Boyle | |
| 6,204,680 B1 | | 3/2001 | Swart et al. | |
| 6,377,059 B2 | * | 4/2002 | Vinther et al. | 324/754 |
| 6,424,166 B1 | * | 7/2002 | Henry et al. | 324/755 |
| 6,464,511 B1 | * | 10/2002 | Watanabe et al. | 439/66 |
| 2002/0115337 A1 | * | 8/2002 | Yamada | 439/482 |

* cited by examiner

*Primary Examiner*—Chandrika Prasad
(74) *Attorney, Agent, or Firm*—John A. Haug

(57) ABSTRACT

An electrical socket (10) mounts a plurality of electrical contact probes (20, 22, 24, 26, 28, 30, 32) for providing an electrical connection between terminals of an electronic package (1,1') received in a seat (10*d*) formed in the socket and respective conductive pads of a DUT board. The contact probes each have a slidable contact tip (20*m*, 26*m*, 28*m*, 30*m*, 32*m*) which is adapted for engagement with a respective terminal of an electronic package received in the socket and which is removable from the contact probe for ease of replacement. The removable contact tips or plungers are provided with a retainer surface (20*t*, 28*t*, 30*t*, 32*t*) for interengagement with a removable retainer member of the socket.

19 Claims, 5 Drawing Sheets

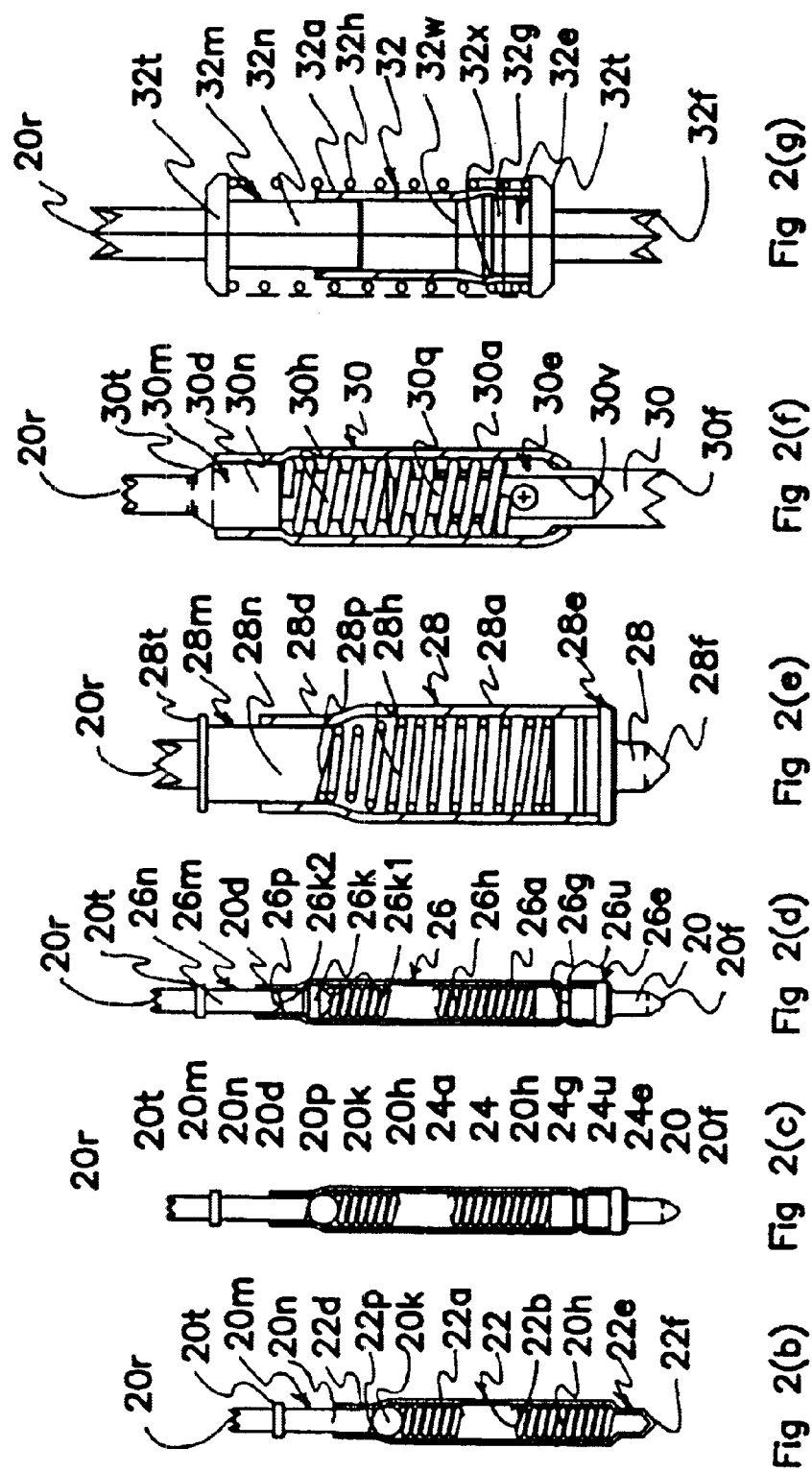

SOCKETS FOR TESTING ELECTRONIC PACKAGES HAVING CONTACT PROBES WITH CONTACT TIPS EASILY MAINTAINABLE IN OPTIMUM OPERATIONAL CONDITION

CROSS REFERENCES TO RELATED APPLICATIONS

Benefit is claimed under 35 U.S.C. Sec. 119(e) of U.S. provisional application No. 60/342,228, filed Dec. 27, 2001.

FIELD OF THE INVENTION

This invention relates generally to equipment used in testing electronic packages, such as integrated circuits, and more particularly to contact probes mounted in sockets for interfacing electronic packages with test equipment.

BACKGROUND OF THE INVENTION

Typically, during testing electronic packages, such as integrated circuit (IC) packages, such packages are removably mounted in sockets which in turn are mounted on a circuit substrate, commonly referred to as a device-under-test (DUT) or load board. The sockets mount individual contact probes for electrically connecting each terminal of a device to be tested to an individual circuit path on the DUT board. The DUT board is in turn electrically connected to computerized test equipment. Over time the contact tips of the probe plungers which make connection with the electronic package tend to become contaminated with solder from solder of the terminals of the packages being tested. Conventionally, when the contact tips become contaminated the contact probes are replaced. The contaminated contract probes are either discarded or, in view of the fact that the remaining structure has a long life expectancy, are recycled by putting the contact tips in a suitable caustic cleaner or brushing off the contact tips. However, cleaning and brushing also removes gold plating material from the contact tips, pushes the solder around, is labor intensive and can result in contamination in the inner workings of the contact probe.

SUMMARY OF THE INVENTION

Objects of the present invention are to provide an improved socket and contact probes which overcome the prior art limitations noted above. Another object of the invention is the provision of a contact probe in which contact tips are more easily maintained in optimum operational condition than in the prior art. Still other objects of the invention are the provision of a socket and contact probes used therewith which are less expensive to maintain in optimum operational condition.

Briefly, in accordance with a preferred embodiment of the invention, a socket used in connection with testing electronic packages, such as integrated circuits, has a base member formed with a plurality of spaced apart bores which extend vertically therethrough and are arranged in a pattern corresponding to the terminal array of the electronic package. An electrical contact probe assembly is received in each bore, the assembly comprising a barrel formed of electrically conductive material and formed with a first closed end having a lower electrical contact tip which extends beyond the bottom surface of the base member for electrical engagement with a contact pad on a circuit board on which the socket is mounted. Another upper contact tip in the form of an upper plunger having an elongated portion at an end thereof is slidably and removably received in an open second end of the barrel and has a second end formed with a selected contact configuration. The upper plunger is slidable inwardly against the bias of a coil spring and is slidably removable from the barrel. In selected embodiments the removable upper plunger is formed with an outwardly radially extending annular shelf between the elongated portion of the upper plunger and the selected contact configuration. The socket preferably has a retainer member mounted on the base member with the retainer member formed with a plurality of vertically extending bores aligned with the vertically extending bores in the base member and provided with a stop surface in each bore thereof limiting outward movement of the plunger from the second end of the barrels as by engaging respective annular shelves. Removal of the retainer member enables one to readily remove any or all of the upper plungers for replacement and/or cleaning.

According to several embodiments, a member is disposed in each barrel between the respective upper contact tip and the coil spring. Preferably, the interengaging surfaces of the insulative member and the plunger are formed so that a lateral force is imparted to the contact tip biasing the elongated portion into good electrical contact with the barrel.

In several preferred embodiments the coil spring is received within the barrel between contact tips at opposite ends of the barrel. In one preferred embodiment the coil spring is disposed externally around the outside surface of the barrel with one end of the spring held in place by deforming the first end of the barrel by pressing an oversize insert portion of a contact tip which causes the barrel to bulge outwardly. The coil spring is chosen having an inside diameter less than the diameter of the bulged portion so that once the spring is pressed over the bulged portion it is held securely in place.

Additional objects and features of the invention will be set forth in part in the description which follows and in part will be obvious from the description. The objects and advantages of the invention may be realized and attained by means of the instrumentalities, combinations and methods particularly pointed out in the appended claims.

BRIEF DESCRIPTION OF THE DRAWINGS

The accompanying drawings, which are incorporated in and constitute a part of the specification, illustrate preferred embodiments of the invention and, together with the description, serve to explain the objects, advantages and principles of the invention. In the drawings.

DETAILED DESCRIPTION OF THE PREFERRED EMBODIMENTS

Figure 1:
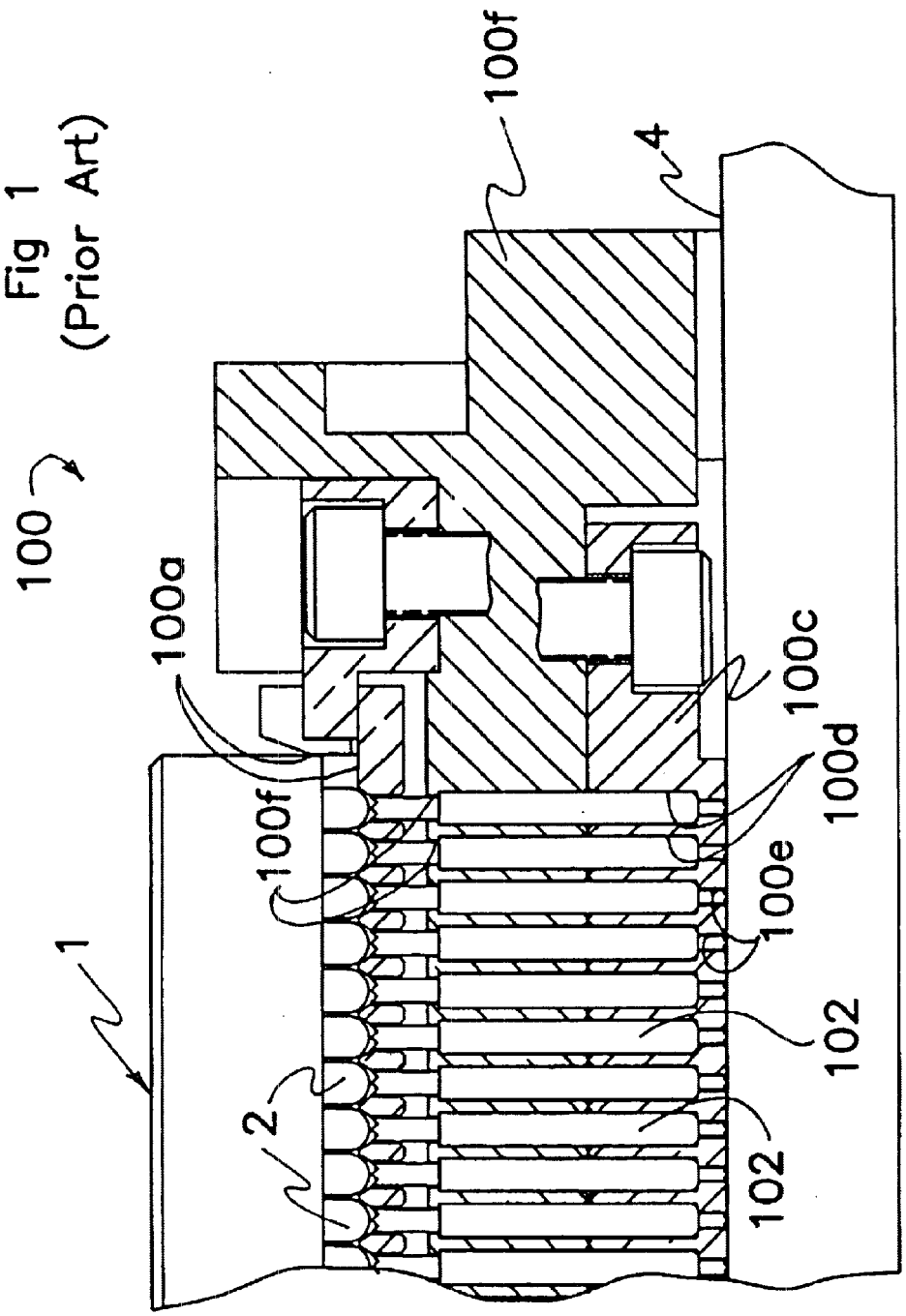
FIG. 1 is a broken away cross sectional view of a prior art socket and an elevational view of prior art contact probes used therein.
Figure 1A:
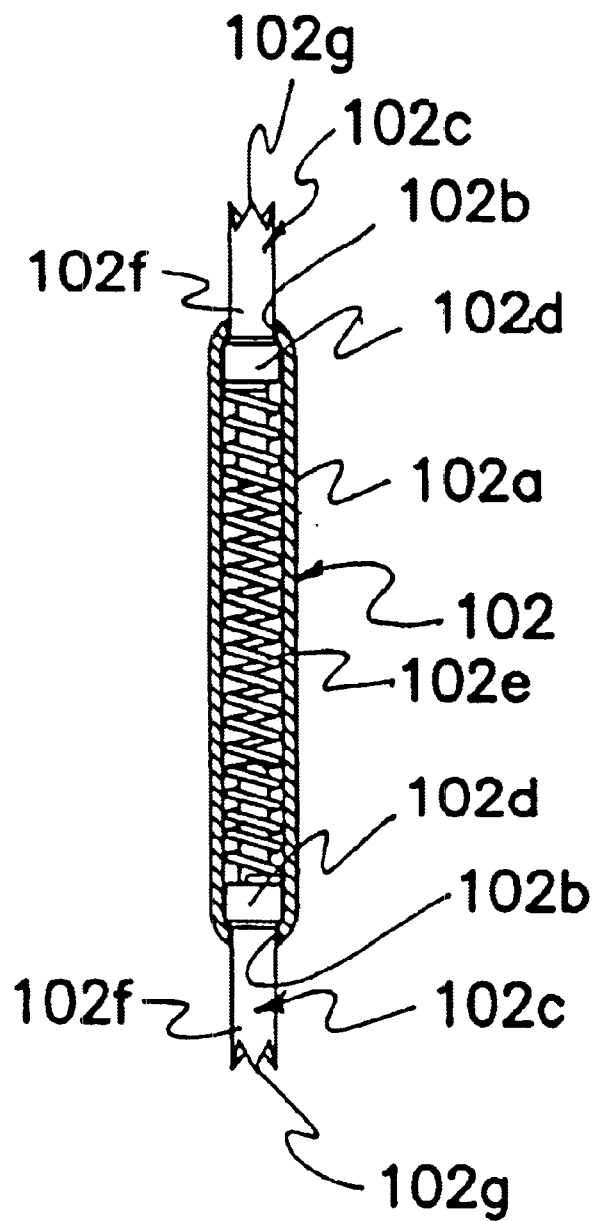
FIG. 1(a) is an enlarged cross sectional view of a prior art contact probe shown in FIG. 1.

FIG. 1 shows a broken away portion of a typical prior art socket 100 mounted on a circuit board 4. An electronic package 1 having a ball grid array of terminals (BGA) is received at a seat 100a in vertically movable member 100b of the socket with solder ball terminals 2 placed in alignment with respective contact plungers or tips 102c mounted in the socket. With reference also to FIG. 1(a), prior art contact probe 102 has a generally cylindrical electrically conductive barrel 102a formed with opposite ends provided with respective openings 102b through which contact plungers 102c extend. Contact plungers 102c comprise a body portion 102d slidably received in the bore of barrel 102a but having an outer diameter greater than that of opening 102b. The inner end of the plungers form a spring seat for coil spring 102e and an elongated cylindrical portion 102f extends through opening 102b and is provided with a selected contact configuration 102g at its free distal end.

As seen in FIG. 1, socket 100 has a lower member 100c formed with a plurality of contact probe receiving bores 100d having a reduced diameter opening 100e at the outer or lower end of the bores to provide access for lower plunger 102c and at the same time form a seat for probe 102. Contact probes 102 are placed in bores 100d and second intermediate member 100f, formed with a corresponding array of contact probe receiving bores 100d is placed on lower member 102c with the upper part of contact probes 102 received in respective bores 100d of intermediate member 100f. The outer or upper portion of each bore 100d is formed with a reduced diameter opening 100f to allow access for the upper plunger 102c as well as serving to retain the contact probes in their seats.

Downward movement of member 10b, as by exerting a downward force on electronic package 1 will bring the solderable terminals 2 into engagement with the contact tips moving them inwardly into the barrels against the bias of springs 102e. The lower contact tips are biased into engagement with conductive pads (not shown) on the top surface of circuit board 4, typically called a DUT or load board.

As noted above, solder residue builds up on contact configurations 102g as a result of being used repeatedly in making electrical engagement with respective solder plated leads or solderball terminals in order to test electronic packages having such leads or terminals and periodically the contact configurations must be cleaned or replaced. Cleaning is a tedious and time consuming operation and replacement of the probes is expensive and a waste of the spring and barrel which have a much longer life expectancy.

Figure 2:
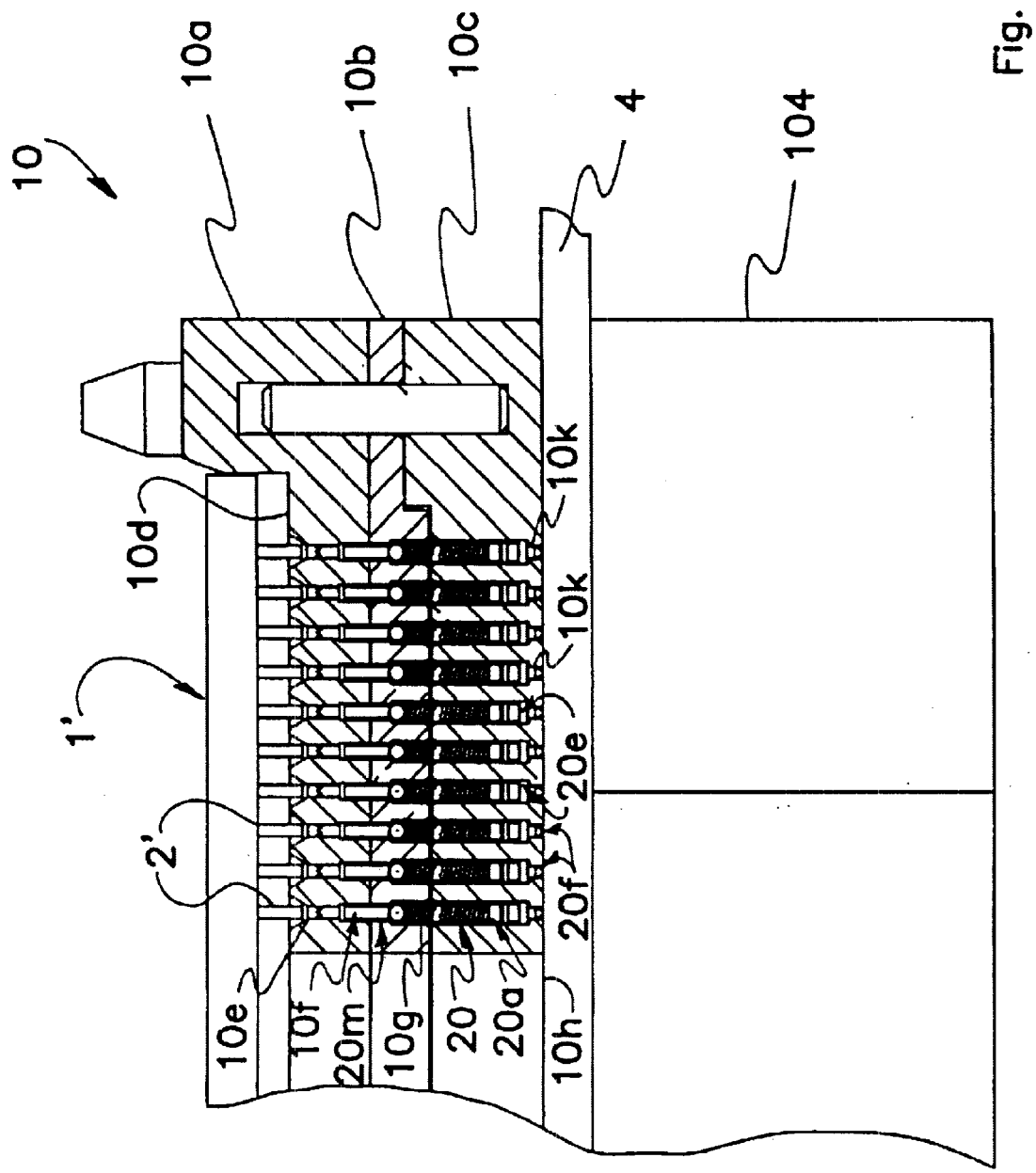
FIG. 2 is a broken away cross sectional view of a socket and contact probes used therein made in accordance with a preferred embodiment of the invention.
Figure 2A:
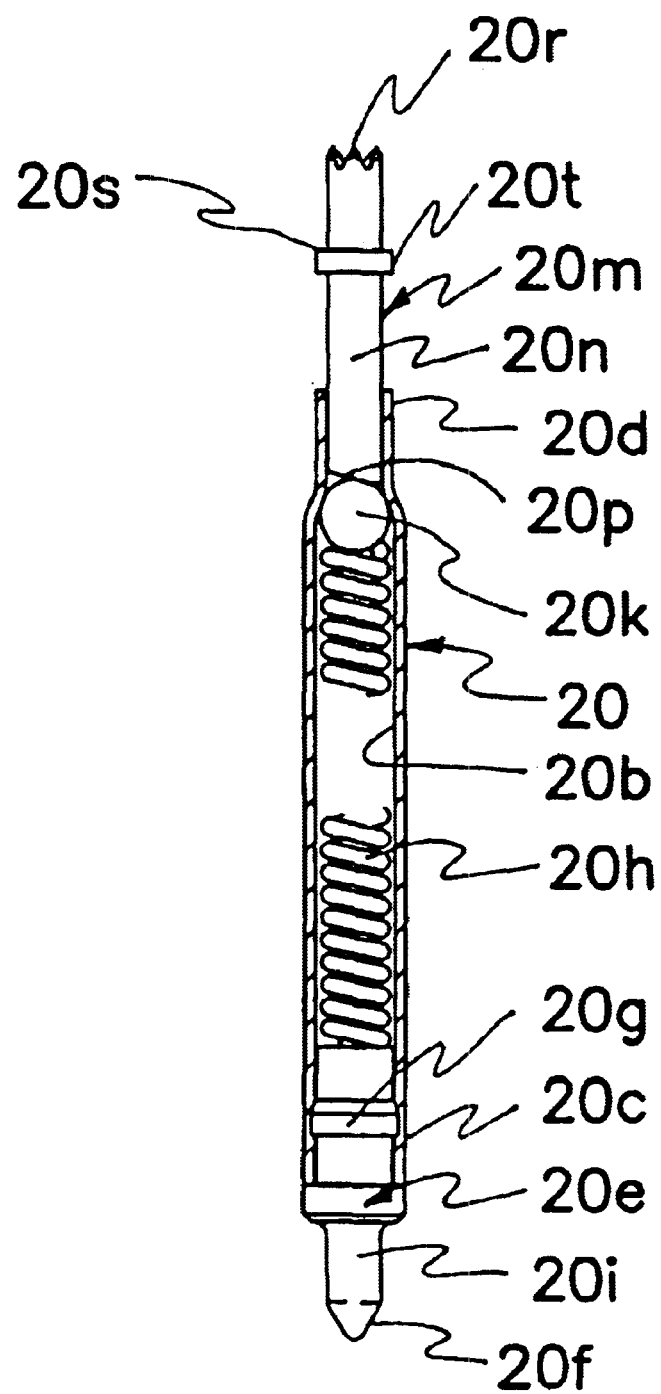
FIG. 2(a) is an enlarged view similar to FIG. 1(a) of a contact probe made in accordance with the invention shown in FIG. 2, and FIGS. 2(b)–2(g) are views similar to FIG. 2(a) but of a reduced scale showing alternative contact probes made in accordance with preferred embodiments of the invention.

With regard to FIGS. 2 and 2(a), a socket 10 along with contact probes received in the socket and made in accordance with a preferred embodiment of the invention overcomes the prior art limitations noted above by forming the upper plunger and socket so that the upper plungers can be readily removed. Contact probe 20 shown best in FIG. 2(a) comprises a generally cylindrical, electrically conductive barrel 20a having an intermediate spring receiving bore portion 20b of a first selected diameter, a first closed end 20c and a second reduced diameter open end 20d having a second selected diameter smaller than the first selected diameter. Preferably open end 20d has an elongated straight bore portion to serve as a bearing surface for a plunger to be discussed. In the FIG. 2(a) contact probe, first end 20c is closed by a first stationary contact tip 20e having an outer end 20i formed with a selected contact configuration such as a slightly rounded projection 20f for engagement with a contact pad (not shown) on board 4. The rounded projection optimizes the useful life of circuit board 4 which typically is quite costly. First contact tip 20e is formed with a flange 20g to form an interference fit in the bore of barrel 20a. The inner end of first contact tip 20e serves as a seat for coil spring 20h.

A second contact tip 20m in the form of a plunger of electrically conductive material has an elongated cylindrical portion 20n having a diameter selected so that portion 20n is closely and slidably received in the bore of open end 20d. Portion 20n has a free distal end which may be formed with a bias surface, that is, the face surface 20p forms an angle other than ninety degrees with the longitudinal axis of portion 20n so that spherical member 20k, biased by coil spring 20h, places a skewing or rotational force on portion 20n, causing improved electrical connection between plunger 20m and barrel 20a. The opposite end of plunger 20m is formed with a selected electrical contact configuration 20r for engagement with a respective electronic package terminal. A radially outwardly extending annular shelf 20s is formed intermediate to electrical contact configuration 20r and elongated portion 20n, as by forming a flange 20t, to cooperate with a retention surface in the socket to be discussed. It will be understood that, if desired, the outer diameter of shelf 20s could be continued all the way to the bias end face 20p when larger diameter barrels are used.

With reference again to FIG. 2, socket 10 has an upper contact tip retainer plate member 10a, an intermediate plate member 10b and a lower plate member 10c. Upper contact tip retainer plate member 10a has an electronic package seating portion 10d and has first, or upper, smaller diameter bores, and second, or lower, larger diameter, bores 10e, 10f respectively, for receiving and retaining removable upper plungers 20m. Bores 10f are continued in the upper portion of intermediate plate member 10b leading into an enlarged diameter portion 10g having a size to accommodate contact probes 20. These bores continue into lower plate member 10c and open onto the lower surface 10h of lower member 10c with a reduced diameter portion 10k. The longitudinal length of bore portions 10f and 10k are such that probes 20 can move a slight amount longitudinally between a position in which projection 20f extends beyond the bottom surface 20h and a position inboard of bottom surface 10h in order to provide a suitable contact force of contact tips 20e on respective contact pads of board 4.

The invention applies to various electronic packages including a BGA package 1 of FIG. 1 as well as a package 1' of FIG. 2 having elongated pin terminals. For example, in a socket adapted for use with a BGA package, movable member 100b would be replaced with a retainer plate member corresponding to retainer plate member 10a of FIG. 1. With respect to electronic package 1' having downwardly extending pins, as shown in FIG. 2, when electronic package 1' is received at seat 10d and terminal pins 2' are pressed downwardly into engagement with second contact tips 20m, springs 20h are compressed and first contact tips 20e are resiliently urged into electrical engagement with respective contact pads on DUT board 4.

When contact configurations 20r of the upper plungers accumulate undesirable amounts of solder residue from previously tested electronic packages, plungers 20m can be readily removed by removal of upper retainer member 10a. Fresh contact tips can then be readily inserted and retainer member 10a replaced with minimal down time of the socket. The contact tips which were removed can then be cleaned and prepared for placement in another socket when needed or discarded. Alternatively, the entire socket can be removed from the DUT board. Then individual plungers can be unloaded, cleaned and reloaded "off line" from the DUT board.

FIGS. 2(b)–2(g) show modified embodiments of electrical probes made in accordance with the invention. In FIG. 2(b) probe 22 is shown having a barrel 22a with an integrally formed first contact tip 22e and intermediate spring receiving portion 22b. The surface joining the contact tip and the spring receiving portion serves as a spring seat for coil spring 20h. Barrel 22 is formed with an open end 22d for reception of removable slidable upper plunger 20m in the same manner as in the first embodiment described above. As in the embodiment shown in FIG. 2, contact probe 22 is preferably mounted in a socket which allows some longitudinal movement of the contact probe to provide suitable contact force on contact pads of a DUT board through coil springs 20h.

The modified contact probe 24 of FIG. 2(c) has a first contact tip 24e similar to that of FIG. 2(a) but having a reduced diameter portion 24g. Contact tips 24e are slidingly inserted in the lower open end of respective barrels 24a and detents 24u are then formed in the wall of barrels 24a to limit sliding motion of the first contact tips 24e to the two longitudinal extremities of reduced diameter portion 24g relative to detents 24u. With this modification, the barrel of contact probes 24 can be immovably mounted in a socket while still providing suitable contact force through coil springs 20h.

First contact tip 26e of contact probe 26 shown in FIG. 2(d) is similar to that of FIG. 2(c) however reduced diameter portion 26g extends longitudinally only long enough to enable detents 26u in the wall of barrel 26a to fixedly capture first contact tip 26e in the first end of the barrel. In this embodiment, a socket with which the contact probe is to be used would preferably be formed with contact probe receiving bores which allow a degree of longitudinal movement of the contact probe as in the FIG. 2 embodiment to allow for suitable contact force for contact tip 26e. Second contact tip, upper plunger 26m, is formed with a rounded distal free end 26p received in opening 20d which cooperates with bias surface 26k2 of intermediate member 26k. A generally conical portion 26k1 serves as an upper seat for coil spring 20h.

FIG. 2(e) shows a contact probe 28 similar to that of FIG. 2(a) but having a relatively shorter length and larger diameter barrel 28a. Further, second contact tip, upper plunger 28m, is provided with bias surface 28p which interfaces directly with coil spring 28h. Outwardly extending flange 28t, barrel opening portion 28d, first contact tip 28e, outer contact tip part 28i, contact configuration 28f and coil spring 28h are all sized to accommodate the increased diameter barrel of the contact probe.

Contact probe 30 of FIG. 2(f) has a barrel 30a formed with the first end of barrel 30a having a reduced diameter opening through which the body of first contact tip or lower plunger 30e is slidingly received. Lower plunger 30e is formed with a centrally located bore 30v through the body portion down into outer portion 30i extending out of the barrel. Second contact tip, upper plunger 30m, is formed with a downwardly, outwardly frustoconical surface 30t which serves as a retaining surface when used with a retainer plate member corresponding to member 10a of socket 10 formed with appropriately sized bores. Upper plunger 30m has a body portion slidingly received in opening 30d of barrel 30a and an elongated, reduced diameter, longitudinally extending rod portion 30g which extends into bore 30v. Spring 30h is received about rod portion 30g and extends from the body portion of contact tip 30m to a spring seat formed on lower plunger 30e. The contact probes can be provided with various contact configurations, such as the single smooth tip portion 20f of several previous embodiments or a type with a plurality of pointed portions as shown at 30f of FIG. 2(f).

Contact probe 32 shown in FIG. 2(g) has a barrel 32a formed with opposite open ends. First contact tip 32e has a generally cylindrical first insert portion formed with an enlarged diameter portion 32g disposed at a longitudinal location preferably intermediate to the inner end thereof at 32w and an outwardly radially extending flange 32t. The diameter of portion 32g is selected to displace the wall of barrel 32a outwardly when contact tip 32e is forced into the lower open end of the barrel to form a bulge in the barrel wall to fixedly mount the first contact tip to the barrel. Coil spring 32h has an inner diameter selected to be less than the outer diameter of the bulged portion 32x of barrel 32a and is received around the external surface of barrel 32a. End 32w of contact tip 32e is formed with a diameter slightly less than the diameter of barrel 32a prior to insertion of the contact tip, the insert portion being tapered from end 32b with an increasing diameter up to the enlarged diameter portion 32g to facilitate insertion of the contact tip into the barrel. The insert portion is forced into the barrel preferably until the barrel bottoms out against flange 32t. Coil spring 32h is then placed over barrel 32a with its lower end forced over bulged portion 32x of the barrel to thereby lock coil spring 32h to the assembly.

Second contact tip, upper removable plunger 32m, has an elongated cylindrical portion 32n formed with a diameter selected to be slidingly received in the upper end of the bore of barrel 32a and the lower surface of flange 32t serves as a spring seat for coil spring 32h. Contact probe assembly 32 is particularly cost effective to assemble by virtue of the fact that coil spring 32h is locked to the assembly. This results in a structure which is advantageous when removing contact tip 32m for cleaning/or replacement in that a separate retainer is not needed to maintain the coil spring in the assembly.

Although the invention has been described with regard to a certain preferred embodiment thereof, variations and modifications will become apparent to those skilled in the art. It is, therefore, the intention that the appended claims be interpreted as broadly as possible in view of the prior art to include all such variations and modifications.

What is claimed:

1. A socket for an electronic package having a plurality of terminals comprising:

a base member formed of electrically insulative material and having a plurality of spaced apart barrel receiving bores extending between a top surface and a bottom surface thereof, a plurality of electrical contact probe assemblies, a probe assembly received in each bore, each probe assembly comprising a generally tubular barrel received in a respective barrel receiving bore formed of electrically conductive material having first and second opposite ends and a longitudinal axis, the first end having an electrical contact configuration in engagement with the barrel and extending below the bottom surface of the base member, the second end being open ended and formed with an elongated, reduced diameter portion, a contact tip having an elongated portion at a first end thereof slidably and removably received in the elongated, reduced diameter portion through the open end of the barrel, a second end of the contact tip having a selected contact configuration, a coil spring mounted in the barrel for placing an outward force on the contact tip, the contact tip being slidable inwardly into the barrel against the bias of the coil spring, a retainer member mounted on the base member, the retainer member having a plurality of contact tip receiving bores extending between a top surface and a bottom surface thereof and aligned with respective bores in the base member, the bores in the retainer member being formed by a surface which includes a stop surface engageable with a corresponding stop surface of the contact tip to limit outward movement of the contact tip, whereby removal of the retainer member allows the contact tips to be easily removed upon contamination by solder residue and the like.

2. A socket according to claim 1 in which the corresponding stop surface of the removable contact tip is a radial, outwardly extending shelf formed between the elongated portion and the selected contact configuration.

3. A socket according to claim 1 in which the elongated, reduced diameter portion of each barrel comprises a tubular wall that serves as a bearing surface for the first end of the respective contact tip and further comprising bias surface means for directing a component of the force of the coil spring on the first end of the contact tip in a direction toward said tubular wall for enhanced electrical connection of the contact tip with the barrel.

4. A socket according to claim 3 in which the coil spring is received in the bore of each barrel and further comprising a non-conductive member slidably received in each barrel between the contact tip and the coil spring, the non-conductive member having an outer diameter greater than the selected diameter of the elongated tubular portion.

5. A socket according to claim 1 in which the contact configuration of the first end of each barrel is formed integrally with the barrel.

6. A socket according to claim 1 in which the first end of each barrel is formed with an opening, an electrically conductive plug is received in and closes the opening of the first end and the electrical contact configuration is formed on a portion of the plug extending out of the opening of the first end.

7. A socket according to claim 6 in which the barrel is formed with a bulged portion near the first end of the barrel and the coil spring is positioned around the outside surface of the barrel, the coil spring having an at rest inside diameter slightly less than the outer diameter of the non-bulged portion of the barrel.

8. A socket according to claim 2 comprising a second stop surface of the socket for engagement with a surface of each barrel.

9. An electrical contact probe assembly comprising a generally cylindrical tubular barrel formed of electrically conductive material having first and second opposite ends and an intermediate coil spring receiving portion having a first selected diameter, the first end being closed and having a selected contact configuration in engagement with the barrel, the second end of the barrel having an elongated, reduced diameter portion formed with an opening, a contact tip having an elongated first end closely and slidably received in the elongated, reduced diameter portion through the opening of the removal of the retainer member allows the contact tips to be easily removed upon contamination by solder residue and the like.

10. An electrical contact probe assembly according to claim 9 in which the elongated, reduced diameter portion comprises a tubular wall which serves as a bearing surface for the elongated portion of the contact tip, and the elongated first end of the contact tip at the second end of the barrel has a longitudinal axis with a distal end formed with a bias surface, the bias surface forming an inclined angle with the longitudinal axis so that a component of the spring force will be applied on the distal end in a direction toward the tubular wall of the barrel.

11. An electrical contact probe assembly according to claim 10 further comprising a member movably disposed in the barrel having an outer periphery larger than the bore of the elongated, reduced diameter portion and the coil spring is disposed between the first end of the barrel and the member.

12. An electrical contact probe assembly according to claim 11 in which the member is generally spherical in configuration.

13. An electrical contact probe assembly according to claim 11 in which the member is generally cylindrical and has a to longitudinal axis and a first end which forms a coil seat, an intermediate portion having an outer diameter greater than the reduced diameter of the elongated, reduced diameter portion and a second end having a surface lying in a plane which is inclined relative to the longitudinal axis.

14. An electrical contact probe assembly according to claim 9 in which the contact configuration at the first end is formed integrally with the barrel.

15. An electrical contact probe assembly according to claim 9 in which the first end of the barrel is formed with an opening, an electrically conductive plug is received in and closes the opening of the first end and the electrical contact configuration at the first end is formed on a portion of the plug.

16. An electrical contact probe assembly according to claim 9 in which a radial, outwardly extending annular shelf is formed on the contact tip between the elongated portion and the contact configuration of the contact tip.

17. An electrical contact probe assembly comprising:

a generally cylindrical tubular barrel formed of electrically conductive material having a longitudinal axis and first and second opposite ends, at least one end having an elongated, reduced diameter portion formed with a side wall and having an opening, first and second contact tips disposed at respective first and second ends, the contact tips having a selected contact configuration, the second contact tip having a cylindrical portion slidably and removably receivable in the opening of the at least one end, a coil spring mounted in the barrel, the coil spring biasing the second contact tip in a direction out of the barrel, and a bias surface for directing a component of the force of the coil spring on the second contact tip in a direction toward the wall of the elongated, reduced diameter portion.

18. An electrical contact probe assembly according to claim 17 in which the coil spring is disposed about the outer surface of the barrel.

19. An electrical contact probe assembly according to claim 17 in which the bias surface is formed on the second contact tip.

* * * * *